United States Patent [19]
Pearson et al.

[11] Patent Number: 5,909,127
[45] Date of Patent: Jun. 1, 1999

[54] CIRCUITS WITH DYNAMICALLY BIASED ACTIVE LOADS

[75] Inventors: Dale Jonathan Pearson, Yorktown Heights; Scott Kevin Reynolds, Granite Springs, both of N.Y.

[73] Assignee: International Business Machines Corporation, Armonk, N.Y.

[21] Appl. No.: 08/601,628

[22] Filed: Feb. 14, 1996

Related U.S. Application Data

[60] Provisional application No. 60/009,197, Dec. 22, 1995.

[51] Int. Cl.⁶ .............................................. H03K 19/094
[52] U.S. Cl. .............................. 326/115; 326/17; 326/83; 326/121; 326/113; 326/31; 326/32; 326/34; 326/126; 326/127; 327/313; 327/318; 327/323; 327/65; 327/67
[58] Field of Search ............................... 326/17, 83, 121, 326/115, 113, 31–34, 126–127; 327/313, 318, 323, 65, 67

[56] References Cited

U.S. PATENT DOCUMENTS

| | | | |
|---|---|---|---|
| 4,450,371 | 5/1984 | Bismarck | 326/17 |
| 4,570,084 | 2/1986 | Griffin et al. | 326/86 |
| 4,617,475 | 10/1986 | Reinschmidt | 326/11 |
| 5,045,807 | 9/1991 | Ishihara et al. | 326/126 |
| 5,216,295 | 6/1993 | Hoang | 326/115 |
| 5,397,938 | 3/1995 | Wilheim et al. | 326/127 |
| 5,486,778 | 1/1996 | Lou | 326/83 |
| 5,488,321 | 1/1996 | Johnson | 327/312 |
| 5,583,456 | 12/1996 | Kimura | 326/115 |
| 5,648,734 | 7/1997 | Tanabe et al. | 326/115 |

OTHER PUBLICATIONS

Horenstein. Microelectronic Circuits and Devices. Prentice–Hall. pp. 521–525, 1990.

M. Yamashina et al, "An MOS Current Mode Logic (MCML) Circuit for Low–Power Sub–GHz Processors", Oct. 1992, IEEE Trans. Electron, V.E75–C No. 10 pp. 1181–1187.

T. Hanyu et al, "A 1.5V–Supply 200MHz Pipelined Multiplier Using Multiple–Valued Current–Mode MOS Differential Logic Circuits", Jan. 1995 1995 IEEE Digest of Tech; Papers, V. 38 pp.314–315.

B.A. Chappell et al, "Fast CMOS ECL Receivers with 100–mV Worst–Case Sensitivity", Feb. 1988, IEEE J. of Solid–State Circuits, V23 #1 pp. 59–67.

*Primary Examiner*—Jon Santamauro
*Attorney, Agent, or Firm*—Louis P. Herzberg; Robert P. Tassinari, Jr.

[57] ABSTRACT

This invention provides a circuit and method to replace the passive resistive or statically biased active load devices with dynamically biased active load devices. This allows the load devices to present an effective load which varies depending on the state of the circuit output. The effective load and the time rate of change of the effective load can be dynamically optimized to improve circuit performance with changing conditions. The effective load is varied according to the state of the circuit by the use of time-delayed negative feedback. The biasing of the load devices is also capable to control the logic swing of the circuit. A bias generating circuit employing a dynamically biased active load is described. This provides a method for a family of logic circuits, especially CML circuits, to operate at low voltage and low power at high switching speeds, having symmetrical rise and fall times and well defined logic signal swings. The output is sampled and maintained at near ideal bias voltage with a voltage follower type circuit which provides a gain of less than unity and finite delay. Particular circuit implementations using various semiconductor technologies are described and many others are possible. Although the invention may find primary use in VLSI logic circuits, especially those requiring high speed and low power, it is also shown to be useful in analog circuits. Alternate circuit configurations for dynamically biased active load devices are described.

34 Claims, 12 Drawing Sheets

CIRCUITS WITH DYNAMICALLY BIASED ACTIVE LOADS

The present application claims priority to copending U.S. provisional application 60/009,197 filed Dec. 22, 1995.

FIELD OF THE INVENTION

The present invention is directed to the field of electronic circuits. It is particularly directed to logic circuits and more particularly to current mode logic circuits.

BACKGROUND OF THE INVENTION

It is a constant endeavor to find ways of speeding up the rise and fall times of switching circuits. This is particularly a problem in circuits supplied from low voltage sources. The problem becomes more severe when employing voltage sources consisting of a battery which demands extremely low current drains.

Typical logic circuits employ a passive resistive load at their outputs. FIG. 1 shows a general diagram of a logic circuit 100 with an input 101 and an output 102, supplied from a power source 104. Often the logic circuit is driven by a current source, not shown in FIG. 1. In order to limit the power drain in such a circuit, the biasing current of the output stage is set as low as practical. An output stage with a bias current set at 0.1 mA, would require its load resistors, $R_L$ 106 to be relatively large, perhaps as high as 5 k ohm. Such high resistances are generally inefficient to implement in a VLSI process, and have relatively large parasitic capacitance associated with them. This furthermore results in a speed restricted circuit with outputs that can only rise exponentially with time constant $R_L C_L$, where $C_L$ 108 is the capacitive load on the output.

Attempts have been made to alleviate these problems with active load devices used in place of the load resistors. Each output resistor is replaced with a conventional constant-current biasing arrangement. However when such a circuit is implemented with MOS devices driven from a low supply voltage, the MOS devices are generally not saturated. Unsaturated MOS devices do not really behave as constant current sources. Effective operation of load replacement dictates a near ideal current source. In addition, the bias point of these MOS devices do not respond to the state of the gate, so the signal swing is not effectively controlled and the transition times are relatively slow. These same disadvantages result even when diode connected MOS devices are used as loads.

SUMMARY OF THE INVENTION

It is therefore an object of the present invention to provide high speed current mode logic (HS-CML) circuits employing delayed negative feedback. It is a further object of this invention that the HS-CML be capable of operating with low voltage sources and low current drains.

It is another object that the HS-CML circuit retains symmetrical rise and fall times and well defined logic signal swings. It is a further object to provide a means to adjust the logic signal swing between desired levels. It is still a further object that the circuit be substantially not dependent on process variations and power supply fluctuations.

It is another object of this invention to provide a device having an active load on its output. The active load has a load input. The device includes an output sensing circuit having a sensing input coupled to the circuit output, a sensing output coupled to the load input, a voltage gain less than unity and a delay. The sensing circuit provides negative feedback to the active load.

In one embodiment the circuit output is a logical output of a logic circuit.

In one embodiment the device is formed using FET semiconductor technology.

In one embodiment the device is formed using bipolar semiconductor technology.

In one embodiment the sensing means is comprised of a transistor having a first transistor terminal coupled to a first supply rail, a gate forming the sensing input, and a second transistor terminal forming the sensing output, and a sensing current source coupled between the sensing output and a second supply rail.

In one embodiment the sensing current source has a sensing current source input to accept a sensing bias.

In one embodiment the device's logic circuit is in a differential amplifier configuration, and includes an amplifier current source. The amplifier current source has an amplifier current source input to accept a logic bias.

It is another object of this invention to provide a bias generator circuit which includes a differential amplifier stage having a first input for accepting a reference voltage, a second input, and an amplifier output circuit forming the sense bias voltage. It also includes a low state voltage setter stage having a setter output coupled to the second input, an active load coupled to the setter output, and an output sensing circuit. The active load having a load input. The output sensing circuit has a sensing input coupled to the setter output, a sensing output coupled to the load input, a voltage gain less than unity and a delay. The sensing circuit provides negative feedback and dynamic bias to the active load.

In one embodiment the differential amplifier in the bias generator circuit includes an amplifier current source. The amplifier current source has an amplifier current source input to accept the logic bias. The low state voltage setter stage includes a setter current source which has an amplifier current source input to accept the logic bias. The generator further includes a reference voltage generating stage forming the reference voltage and coupled to the first input of the amplifier, and a reference current stage forming the logic bias.

In one embodiment the reference current stage in the bias generator circuit includes a current transistor having its gate tied to its drain, and its source coupled to a first power rail, and a resistor coupled between the drain and a second power rail, and wherein the logic bias is produced at the transistor drain.

It is another object of this invention to provide a logic gate having an active load at the at least one output and a time-delayed negative feedback bias circuit. The bias circuit dynamically biases the active load such that the active load presents an effective load that varies according to the logic state of the output.

In one embodiment the dynamically biased load becomes turned-on less strongly when the gate output is in a high logic state, and becomes turned-on more strongly when the gate output is in a low logic state.

In one embodiment the bias circuit controls the logic swing of the output. In one embodiment the logic swing is between $V_{DD}$ and $(V_{DD}-300 \text{ mv})$. In one embodiment the transition time for changing between the high logic state and the low logic state is less than 200 ps.

It is still another object of this invention to provide a method for dynamically biasing an active load on a circuit's output. The active load has a load input. The method comprising the steps of: sensing the signal at the circuit's output; amplifying the signal level with a gain of less than unity; delaying the signal to form a delayed output; feeding the delayed output to the load input to provide negative feedback to the circuit output.

In one embodiment the sensing step includes the steps of: providing a transistor having a first transistor terminal coupled to a first supply rail, a gate forming a sensing input, a second transistor terminal forming the delayed output; and providing a sensing current source coupled between the sensing output and a second supply rail.

In one embodiment the sensing current source has a sensing current source input to accept a sensing bias.

In one embodiment the circuit is a CML gate which is in a differential amplifier configuration. The circuit is further comprised of an amplifier current source. The amplifier current source has an amplifier current source input to accept a logic bias.

It is still another object of this invention to provide a method to generate a bias voltage comprising the steps of: feeding a reference voltage to a first input of a differential amplifier; providing a low state voltage setter stage having a setter output, and an active load coupled to the setter output; providing delayed negative feedback from the setter output to the active load with a voltage gain of less than unity; feeding the setter output to a second input of the differential amplifier; and forming a bias voltage at the output of the differential amplifier.

In one embodiment the method includes the additional step of: providing the differential amplifier with an amplifier current source, the amplifier current source having an amplifier current source input to accept a logic bias; providing a setter current source to the low state voltage setter stage, the setter current source having an amplifier current source input to accept the logic bias; providing a reference voltage generating stage to form the reference voltage; and providing a reference current stage forming the logic bias.

BRIEF DESCRIPTION OF THE DRAWINGS

These and other objects, features, and advantages of the present invention will become apparent upon further consideration of the following detailed description of the invention when read in conjunction with the drawing figures, in which.

DETAILED DESCRIPTION OF THE INVENTION

The present invention provides a means and method to impart a dynamically varying bias to an active load employing delayed negative feedback. When employed properly, this results in circuits operating at lower currents and at higher speeds than otherwise achievable. The term dynamic biasing is used to signify that the active load presents an output load which changes its characteristic upon transition from one output state to another output state. It is advantageously used in low voltage and low power circuits, while retaining essentially symmetrical rise and fall times and well defined logic signal swings. Dynamic biasing further provides increased immunity to process and power supply variations. This is because it allows the load to be adjusted independently of the operating point of the stage. It thus allows the output voltage swing to be set independent of the stage current and independent of process parameters such as device transconductance.

Although useful in many types of applications, dynamic biasing of active loads is very advantageous in VLSI logic circuits, especially those requiring high speed and low power. It is particularly beneficial in CML applications. Therefore, CML type circuits are used herein as the basic circuit to describe the invention. These circuits generally employ complementary inputs and produce complementary outputs. This however, is not required to produce the concept and intent of the invention. The inventive circuit is herein referred to as a high speed current mode logic (HS-CML) circuit. In all the figures showing MOS devices, the sources and drains are not marked. It is understood that the sources and drains are positioned with regard to the power supply rails in standard polarity configuration for the particular n-type and/or p-type devices used.

Figure 1A:
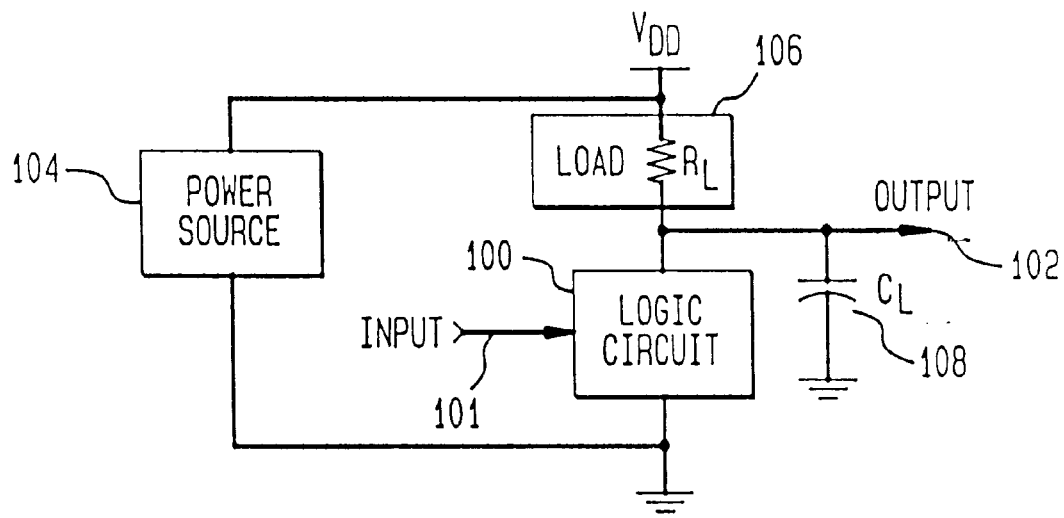
FIG. 1(a) shows a general diagram of a logic circuit with a passive resistive load.
Figure 1B:
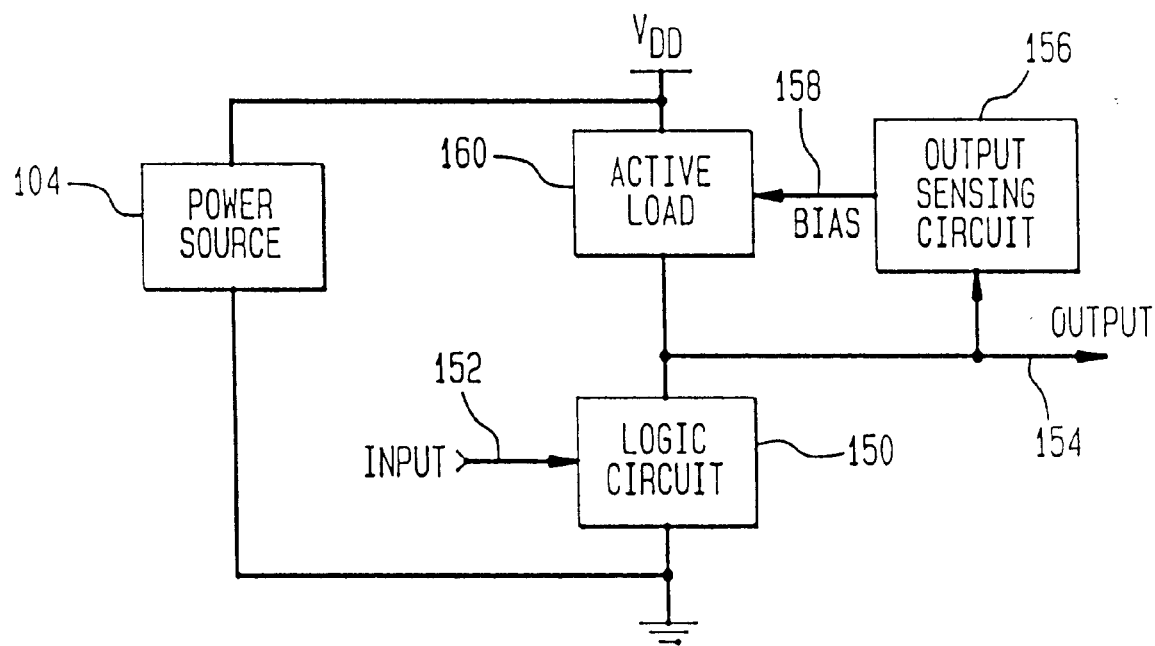
FIG. 1(b) shows a diagram of a logic circuit with a dynamically biased active load in accordance with the present invention.

FIG. 1(b) shows a generalized block diagram of the invention for a logic circuit 150 having an input 152. An output sensing circuit 156 is inserted between the logic output 154 of the logic circuit 150 and the bias input 158 of the active load 160. The purpose of the sensing circuit 156 is to sense the output state and present a state-dependent biasing voltage at the bias input 158 of the active load 160. The biasing voltage determines the degree of turn-on of the active load. The degree of turn-on is represented by the amount of current flowing in the active load. The circuit is so configured to control both the degree of turn-on and the timing of the transition between a first degree of turn-on and a second degree of turn-on. The degree of turn-on and the transition time are such as to substantially optimize and balance both the switching times and state voltage levels of the logic circuit output. This type of active load, which presents to the logic output a changing and state dependent load is said to be a dynamically biased active load.

Use of a dynamically biased active load enables a circuit designer to set an optimal effective load resistance. This enhances gate switching speed even at very low load bias currents. The circuit is useful for low supply voltages and low bias currents. In one embodiment the supply voltage is 0.8 volts and the load bias current is 20 microamps. When employing CMOS (5×), with a ¼ micron effective electrical gate length, a load bias current of 10 microamperes is useful. In one embodiment using a power supply of 1.4 VDC, when the output is in a logic low state the output is typically 300 to 500 mV below $V_{DD}$' and when the output is in a logic high state, the output is typically at $V_{DD}$.

Figure 2:
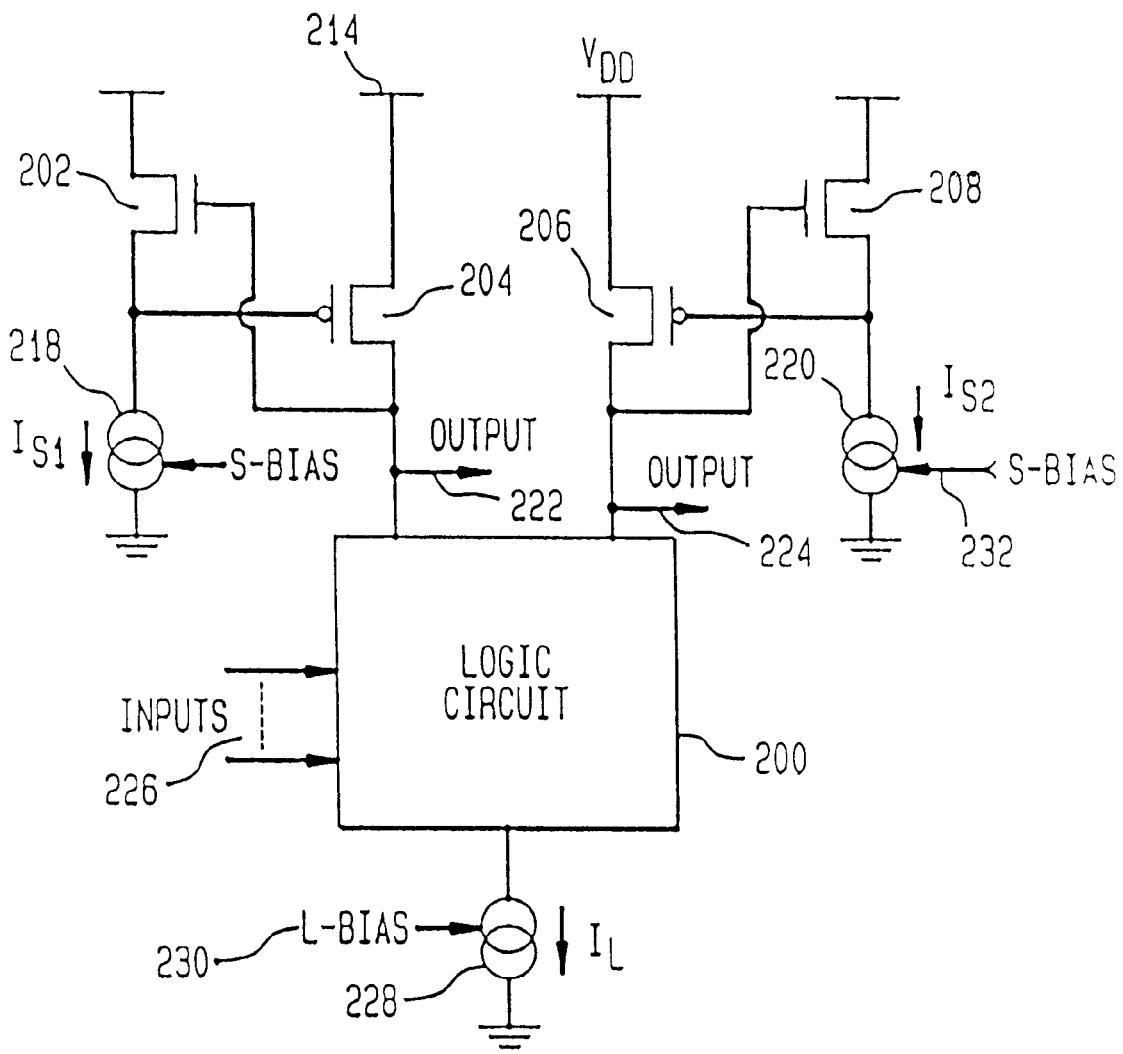
FIG. 2 shows a CMOS high speed current mode logic, HS-CML, circuit with dynamically biased active loads in accordance with the present invention.

FIG. 2 shows a CMOS high speed current mode logic, HS-CML, circuit with dynamically biased active loads in accordance with the present invention. The logic circuit 200 implements a logic function having a pair of complementary outputs, B-output 222 and NOT-B-output 224. The outputs normally come from a differential amplifier type of logic circuit configuration driven by a current source 228. Devices 202 and 208 and their associated biasing sources 218 and 220 comprise the respective output sensing circuits. Devices 204 and 206 are the respective dynamically biased active loads. Specifically, device 202 acts as a source follower and level shifter, sampling the B-output 222 and maintaining near ideal bias voltage on device 204. When the B-output 222 is in a logic low state, device 202 tends to turn device 204 'on' more heavily. This limits the degree of signal swing of B-output 222, and shortens its low to high transition time when the inputs 226 become such as to cause the logic circuit 200 to change state, bringing B-output 222 to a logic high state. Conversely, when the B-output 222 is in a logic high state, device 204 is turned-on less strongly. This causes a shortening of the high to low transition time when the inputs 226 become such as to cause the logic circuit 200 to change state, returning B-output 222 to a logic low state. The circuit configuration uses to advantage the physical phenomena that when the logic circuit switches, the changes of the voltage at the gate of device 204 must always lag behind the voltage changes of B-output 222. This is due to the intrinsic capacitive loading on the gate of 202. It is also due to the slew rate limitations of device 202 relative to device 204, because of device 202 is caused to operate with a lower bias current than device 204. This actually increases the switching speed of the B-output. It allows the logic circuit to switch states before device 204 which serves as the active load is rebiased. The NOT-B-output 224 acts identically but complementary to the B-output 222. It goes high when its complement goes low and vice versa.

The HS-CML shown in FIG. 2, replaces the resistors or statically biased active load devices with dynamically biased load devices. This allows the load devices to present an effective load which varies depending on the state of the circuit. Therefore, the effective load and the time rate of change of the effective load can be optimized to improve circuit performance.

Normally the drive for all the current sources is common. A further circuit enhancement results by separating the drives for the logic tree current source $I_L$ 228, from the drive for the sensing tree current sources $I_{B1}$ 218 and $I_{B2}$ 220. The drive for the logic tree current source $I_L$ 228, is logic bias voltage L-BIAS 230. It sets the current value for the logic circuit. The drive for the sensing tree current sources $I_{S1}$ 218 and $I_{S2}$ 220, sensing bias voltage S-BIAS 232, sets the current value for the sensing circuits. This drive separation allows the active load to be adjusted independently of the differential amplifier operating point. In this manner the logic output voltage swing can be more precisely defined. In most cases, the output voltage swing can be made substantially independent of the differential amplifier current. This could generally not be done in previous current mode logic circuits. The output voltage swing can also be made substantially immune to process variations and operating conditions. A novel circuit for generating separate L-BIAS 230 and S-BIAS voltages for HS-CML circuits is described below.

Figure 3:
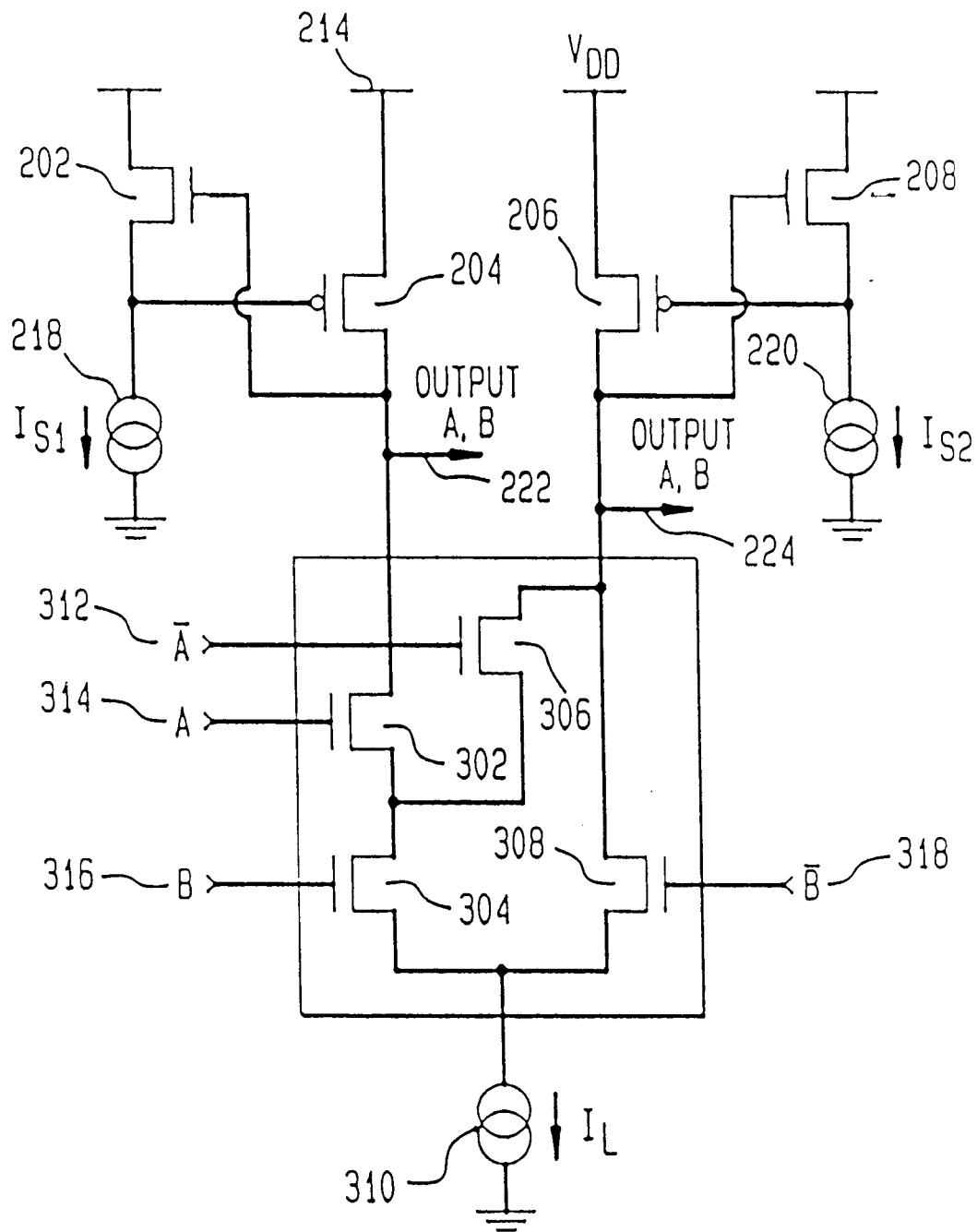
FIG. 3 shows a CMOS CML circuit for a logic circuit performing the function of an AND/NAND gate with the dynamically biased active load in accordance with the present invention.

FIG. 3 shows a CMOS CML circuit for a logic circuit 200 of FIG. 2, performing the function of an AND/NAND gate with the dynamically biased active load. The logic circuit 200 of FIG. 2 is formed in FIG. 3, with devices 302 to 308 and their biasing source 310 to implement the AND/NAND logic function. Devices 202–208 and their associated biasing sources comprise the dynamically biased active load as described for FIG. 2. One output 224 gives the AND of A and B, derived from the states of inputs A 314, NOT-A 310, B 316 and NOT-B 318. The other output 222 gives the NAND of A and B.

Figure 4:
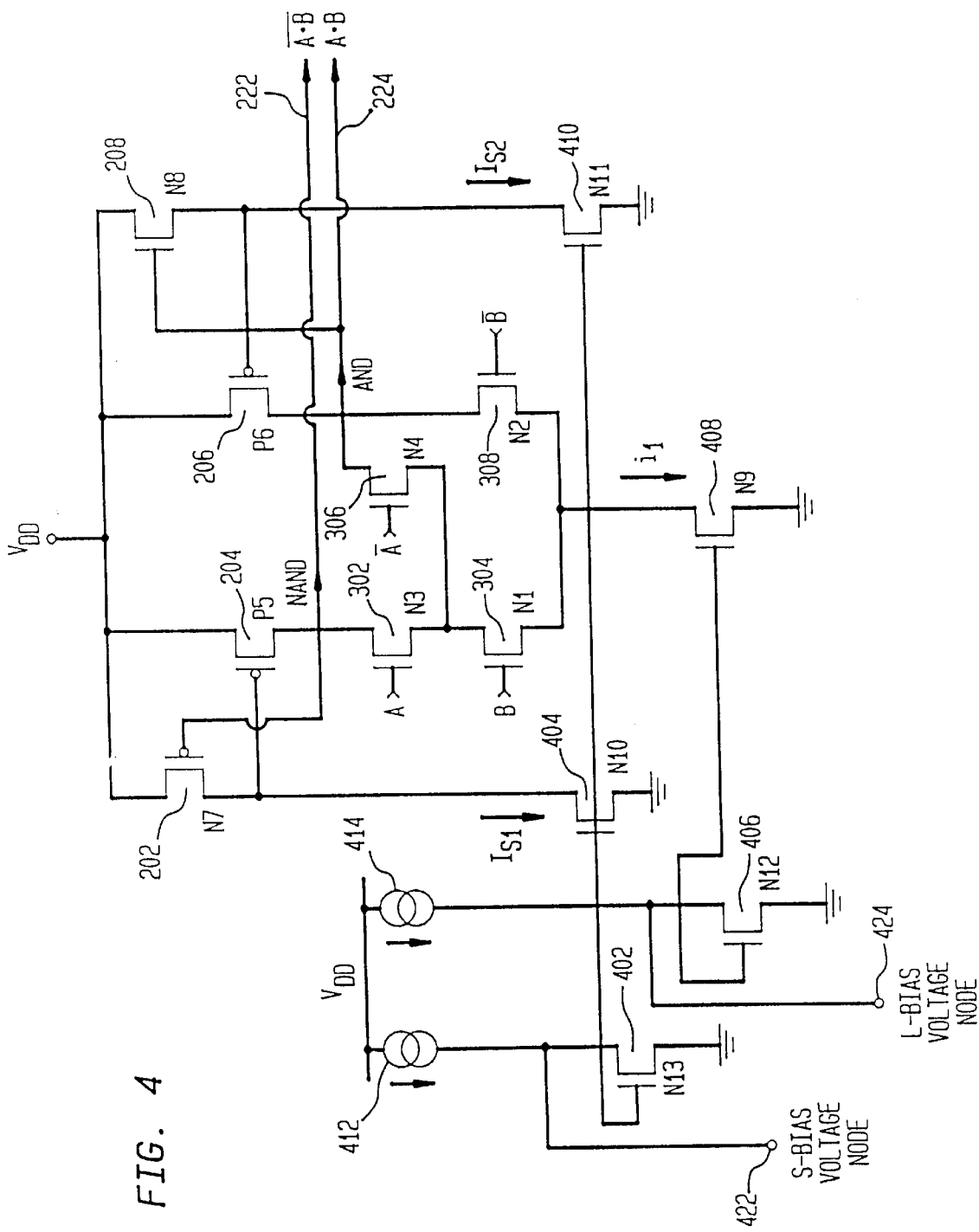
FIG. 4 shows the AND/NAND gate circuit of FIG. 3 including additional devices needed for biasing.
Figure 5:
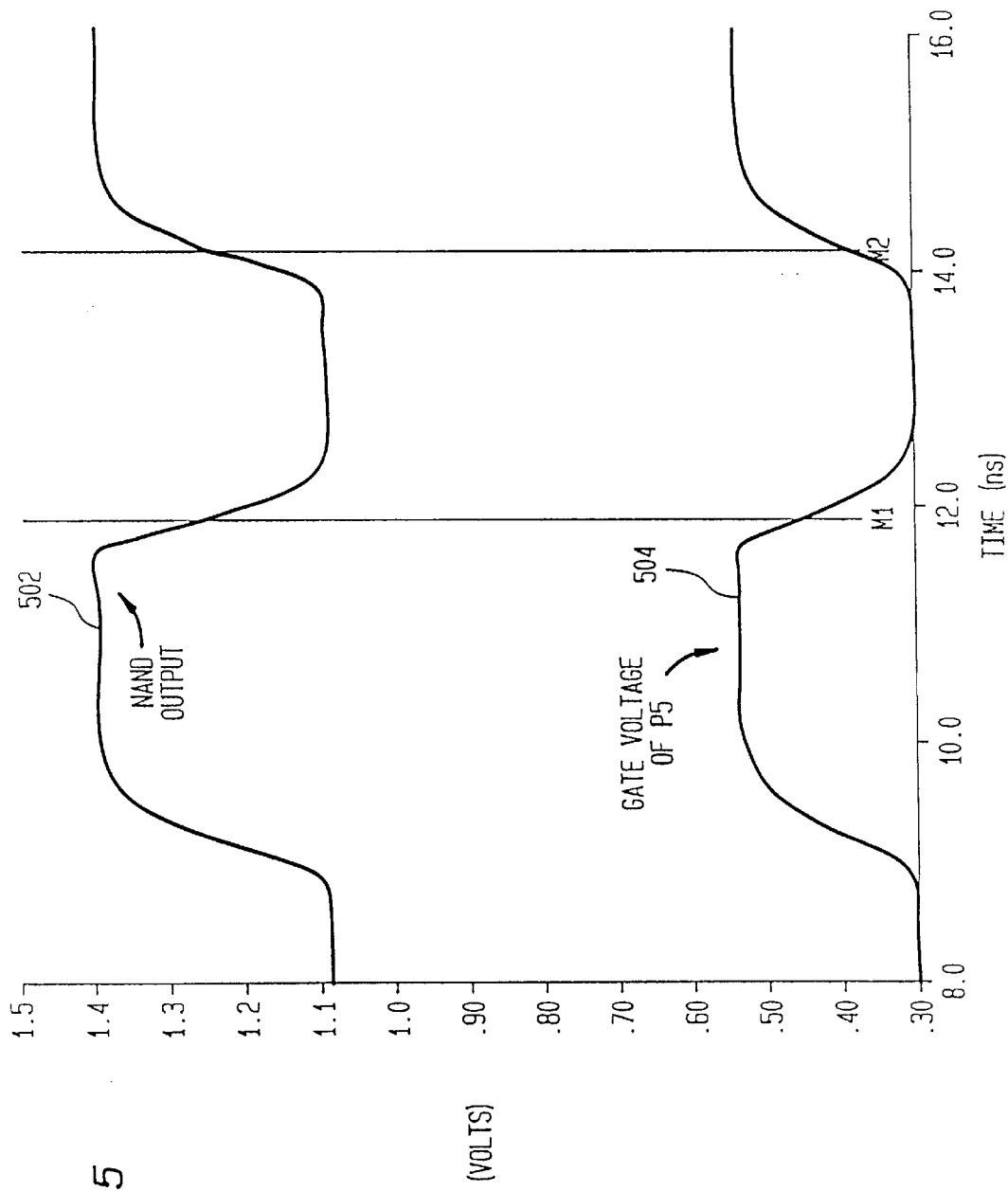
FIG. 5 shows simulated node voltages and transition switching times for the circuit of FIG. 4 when $V_{DD}$ is 1.4 volts.

FIG. 4 shows the more complete AND/NAND gate circuit including additional devices needed for biasing. Although it may be implemented using a common drive for all the current sources, it is shown in a configuration with separate S-BIAS and L-BIAS drives. Device 402 together with current source 412 provide the S-BIAS voltage, at node 422, for driving bias current sources 404 and 410. Device 406 together with current source 414 provide the L-BIAS voltage, at node 424, for driving logic current source 408. FIG. 5 shows simulated node voltages and transition switching times for the circuit of FIG. 4 when $V_{DD}$ is 1.4 volts. It shows the transition curve 502 of the NAND output 222 and the slightly delayed transition curve 504 of the gate voltage of device 204. In the embodiment shown the delay is estimated to be about 20 picoseconds. The rise and fall times are in the order of 250 ps.

The AND/NAND circuit of FIG. 4, implemented with CMOS(5×) devices, at $V_{DD}$ Of 1.4 volts, and with the worst case slow process corner, should produce a propagation delay in the order of 160 ps. This would be a factor of 2 to 3 times faster than the same gate with ideal 5 k ohm load resistors and the same bias current.

Figure 6:
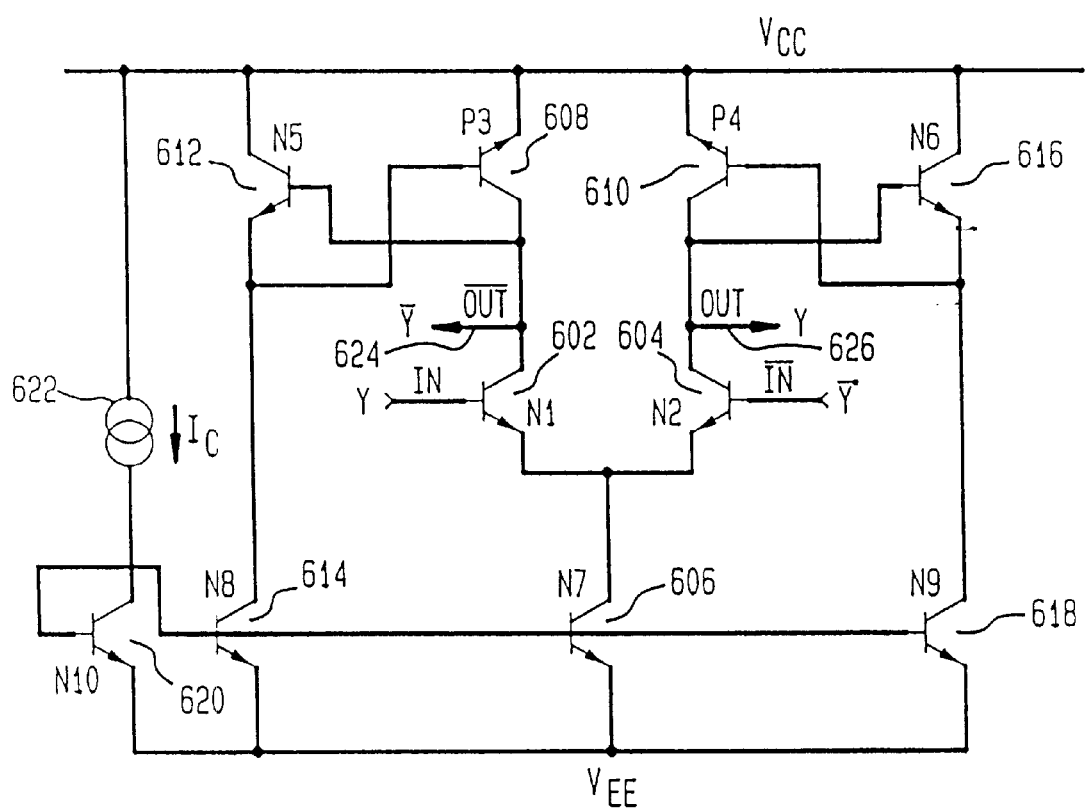
FIG. 6 shows a complementary CML inverting buffer with dynamically biased active loads implemented using bipolar transistors in accordance with the present invention.

Although an important utilization of the present invention is for implementations employing low current MOS technology, it is similarly beneficial for enhancing circuit performance using other semiconductor technologies. For example, FIG. 6 shows a complementary CML inverting buffer, with dynamically biased active loads implemented using bipolar transistors. Transistors 602 and 604 perform the complementary inverting logic function and are both driven by current source transistor 606. Active load transistor 608 is dynamically biased by sensing transistor 612 which senses NOT-Y-output 603. Transistor 614 forms a current source for transistor 612. Active load transistor 610 is dynamically biased by Y-output 605 sensing transistor 616. Transistor 618 forms a current source for transistor 616. Transistor 620 and current source 622 provide the common drive for current source transistors 606, 614 and 618.

Figure 7:
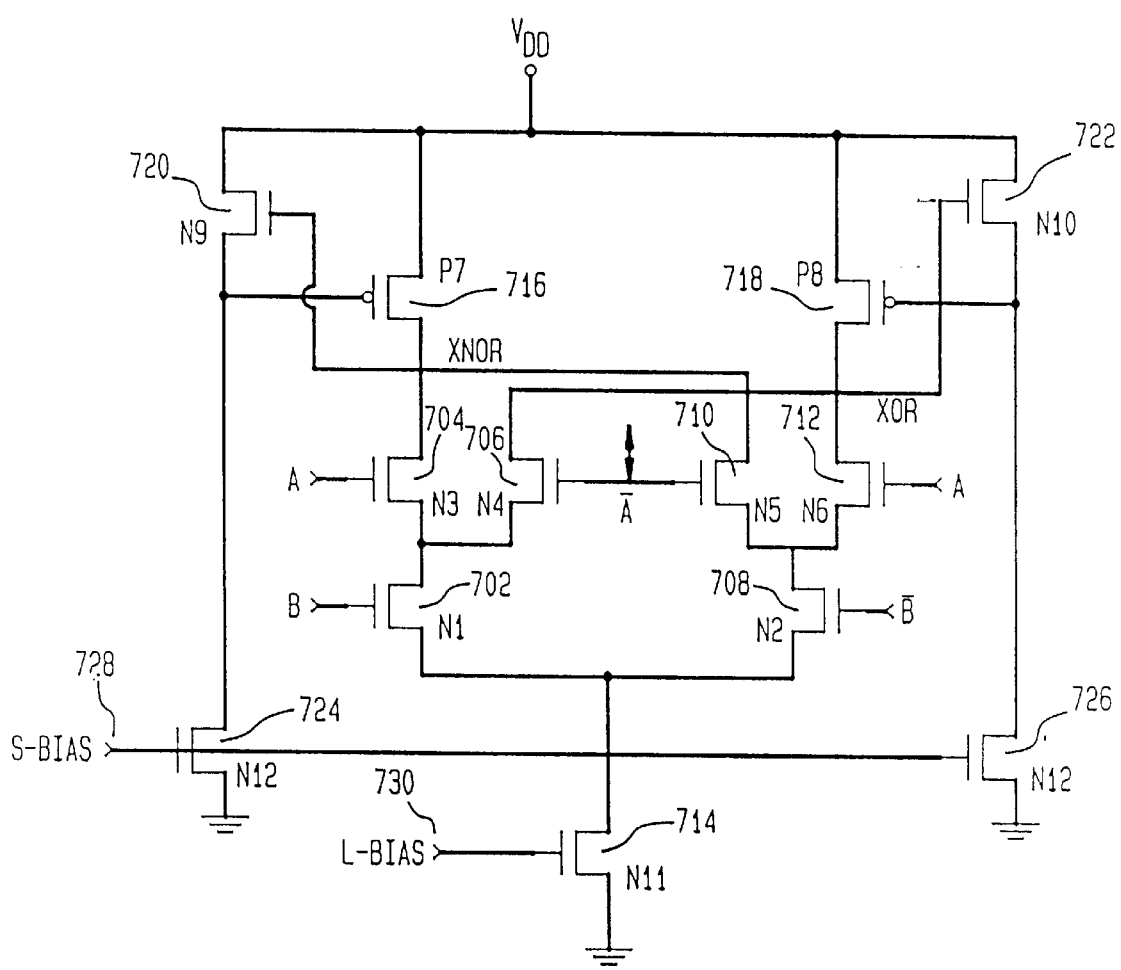
FIG. 7 shows a configuration of a complementary XOR/XNOR gate having dynamically biased active loads, and having separate S-BIAS and L-BIAS drives in accordance with the present invention.

A configuration of a complementary XOR/XNOR gate having dynamically biased active loads, and having separate S-BIAS and L-BIAS drives, is shown in FIG. 7. The XOR/XNOR logic function is implemented with two identical triplets of CMOS transistors connected in a differential amplifier configuration. Transistor 714 is a current source driven by the L-bias 730 voltage and supplies the differential amplifier currents. One triplet is comprised of transistors 702, 704 and 706. The other triplet is comprised of transistors 708, 710 and 712. Input A is fed to the gates of 704 and 712. NOT-A is fed to the gates of 706 and 710. Input B is fed to the gate of 702 and NOT-B is fed to the gate of 708. The exclusive NOR output is taken off the drains of 704 and 710 tied together. The exclusive OR output is taken from the drains of 706 and 712 tied together. Transistor 716 is dynamically biased by transistor 720. Transistor 720 is fed by current source transistor 724 which is in turn driven by S-BIAS 728. Transistor 718 is dynamically biased by transistor 722. Transistor 722 is fed by current source transistor 726 which is in turn also driven by S-BIAS 728.

Figure 8:
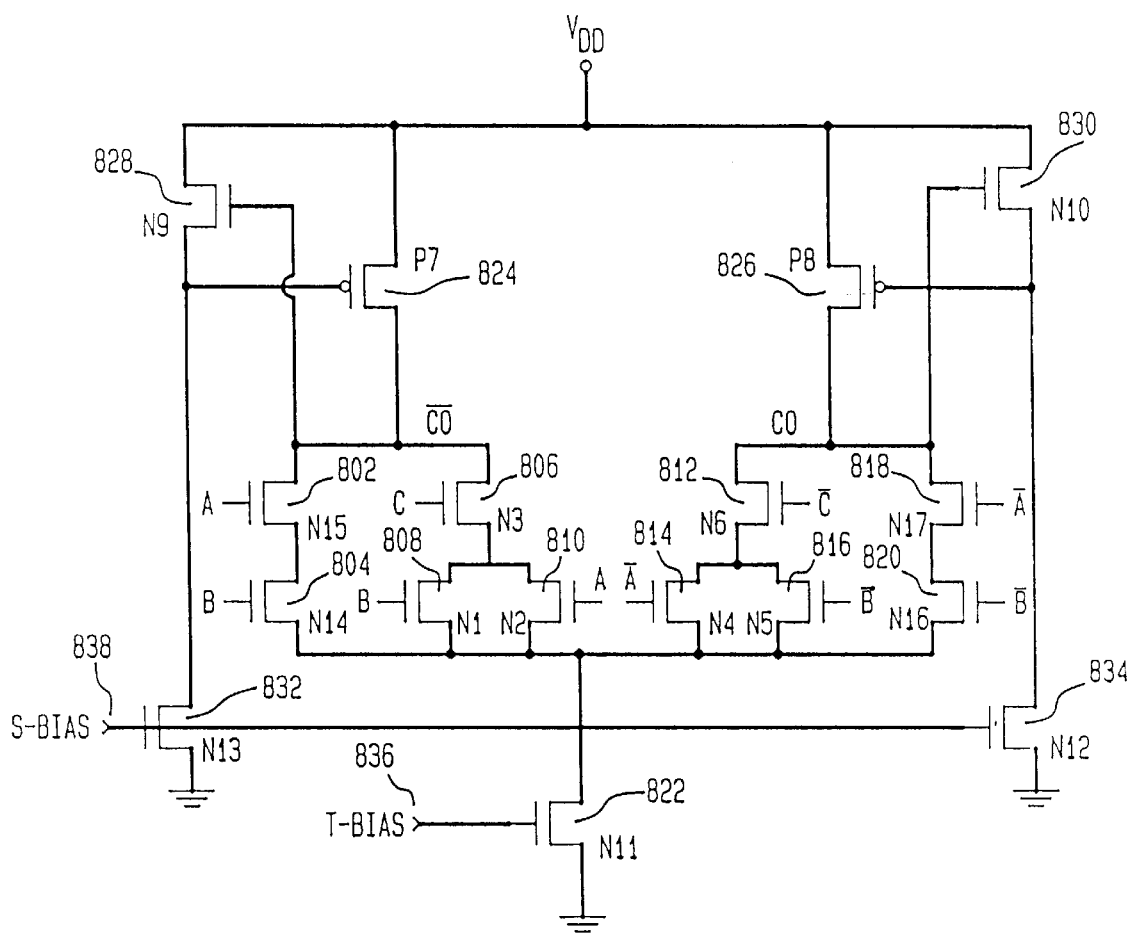
FIG. 8 shows a configuration of a complementary majority function having dynamically biased active loads, and having separate S-BIAS and L-BIAS drive inputs in accordance with the present invention.

A configuration of a complementary majority function having dynamically biased active loads, and having separate S-BIAS and L-BIAS drive inputs, is shown in FIG. 8. Transistors 802, 804, 806, 808, 810, 812, 814, 816, 818 and 820 perform the logic function. Transistor 822 is a current source driven by the L-bias 836 voltage and supplies the differential amplifier currents. The true function output CO is taken at the common point of transistors 802 and 806. The not-true function output NOT-CO is taken at the common point of transistors 812 and 818. Transistor 824 is dynamically biased by transistor 828. Transistor 828 is fed by current source transistor 832 which is in turn driven by S-BIAS 838. Transistor 826 is dynamically biased by transistor 830. Transistor 830 is fed by current source transistor 834 which is in turn driven by S-BIAS 838.

Figure 9:
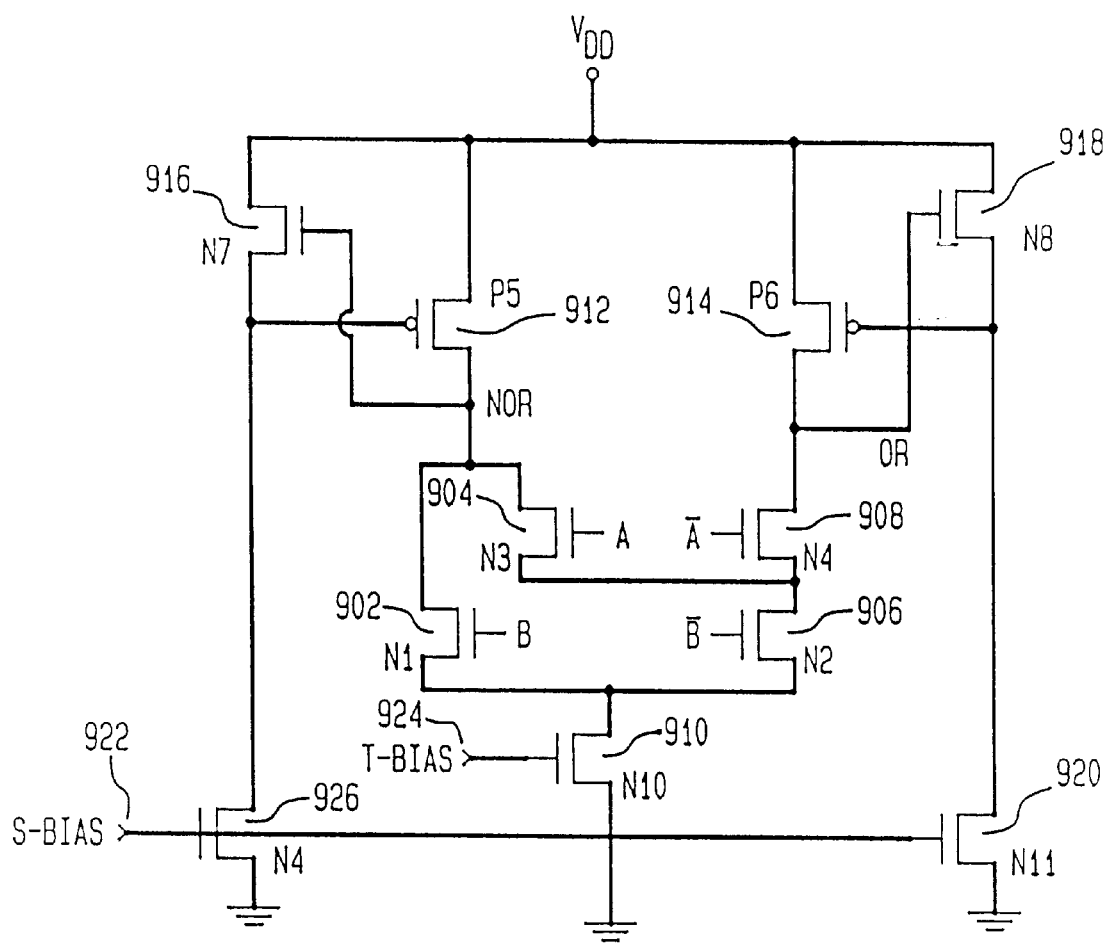
FIG. 9 shows a configuration of a complementary OR/NOR gate having dynamically biased active loads, and having separate S-BIAS and L-BIAS drive inputs in accordance with the present invention.

A configuration of a complementary OR/NOR gate having dynamically biased active loads, and having separate S-BIAS and L-BIAS drive inputs, is shown in FIG. 9. Transistors 902, 904, 906, and 908 perform the logic function. Transistor 910 is a current source driven by the L-bias 924 voltage and supplies the differential amplifier currents. The OR function output is taken at the common point of transistors 908 and 914. The NOR function output is taken at the common point of transistors 904 and 912. Transistor 912 is dynamically biased by transistor 916. Transistor 916 is fed by current source transistor 926 which is in turn driven by S-BIAS 922. Transistor 914 is dynamically biased by transistor 918. Transistor 918 is fed by current source transistor 920 which is in turn driven by S-BIAS 922.

Figure 10:
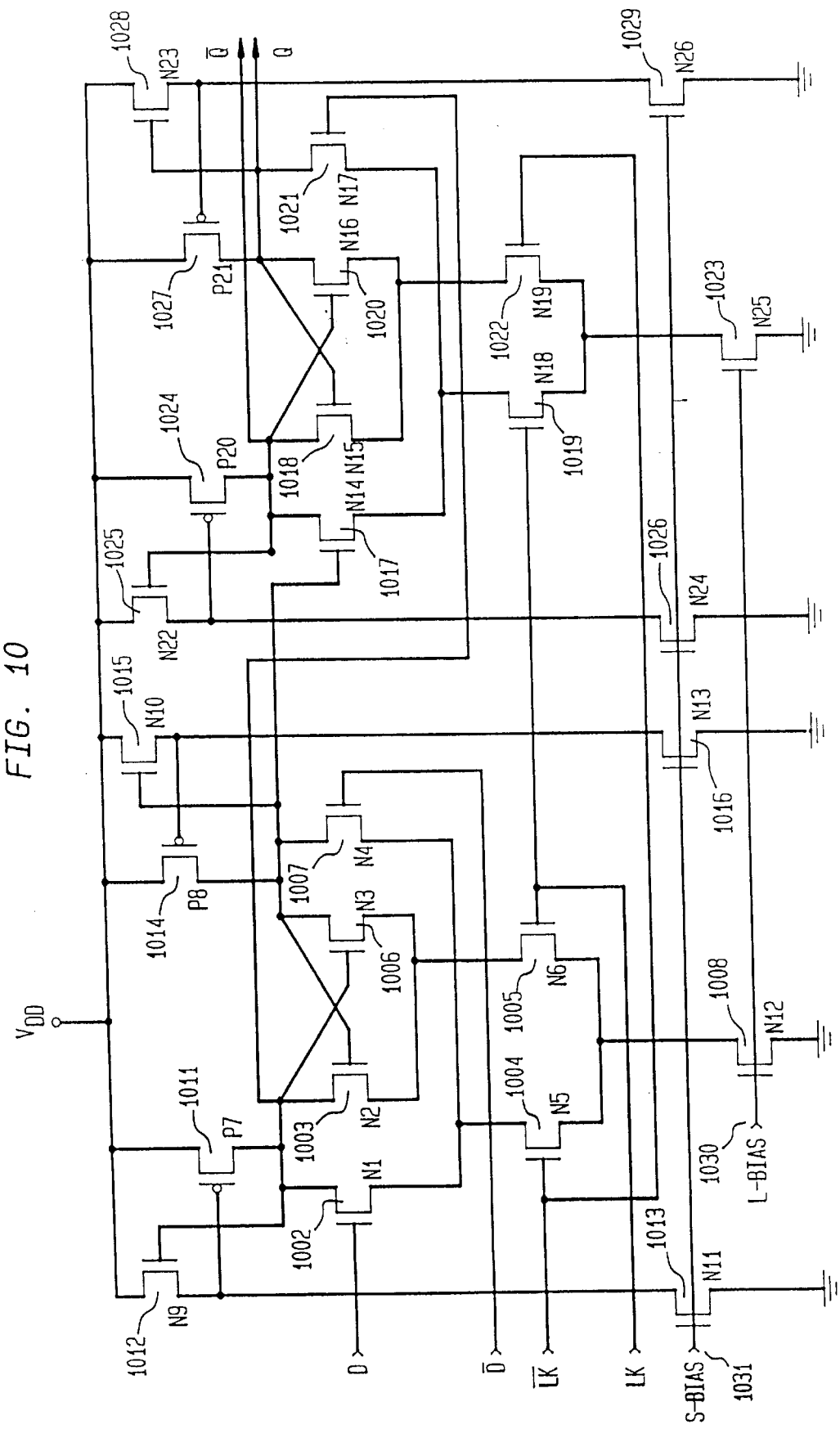
FIG. 10 shows a configuration of a logic function including memory elements performing a complementary master-slave flip flop function in accordance with the present invention.

A configuration of a more complex logic function including memory elements performing a complementary master-slave flip flop function is shown in FIG. 10. The flip flop shown has multiple dynamically biased active loads and separate S-BIAS and L-BIAS drive inputs. Transistors 1001–1007 form the master flip-flop. Transistor 1008 is a current source driven by the L-bias 1030 voltage and supplies the differential amplifier currents. Transistor 1011 is dynamically biased by transistor 1012. Transistor 1012 is fed by current source transistor 1013 which is in turn driven by S-BIAS 1031. Transistor 1014 is dynamically biased by transistor 1015. Transistor 1015 is fed by current source transistor 1016 which is in turn also driven by S-BIAS 1030. Transistors 1017–1022 form the slave flip-flop. Transistor 1023 is a current source driven by the L-bias 1030 voltage and supplies the slave's differential amplifier currents. Transistor 1024 is dynamically biased by transistor 1025. Transistor 1025 is fed by current source transistor 1025 which is in turn driven by S-BIAS 1031.

Transistor 1027 is dynamically biased by transistor 1028. Transistor 1028 is fed by current source transistor 1029 which is in turn also driven by S-BIAS 1030.

From the circuits described, it should be evident to those skilled in the art that other logic gates, as well as latches and registers, could be similarly implemented. Thus, a complete general logic family may be developed using the invention means and concept. It could be implemented in CMOS, bipolar, or BiCMOS VLSI processes. HS-CML circuits formed with CMOS5X devices with the dynamically biased active load described would have significant performance advantages over CML gates with resistor loads or statically biased active loads. Although most circuits are shown with one power supply and with one power rail grounded, the circuits may be implemented with only positive power supplies, negative power supplies or a mixture of these.

Figure 11:
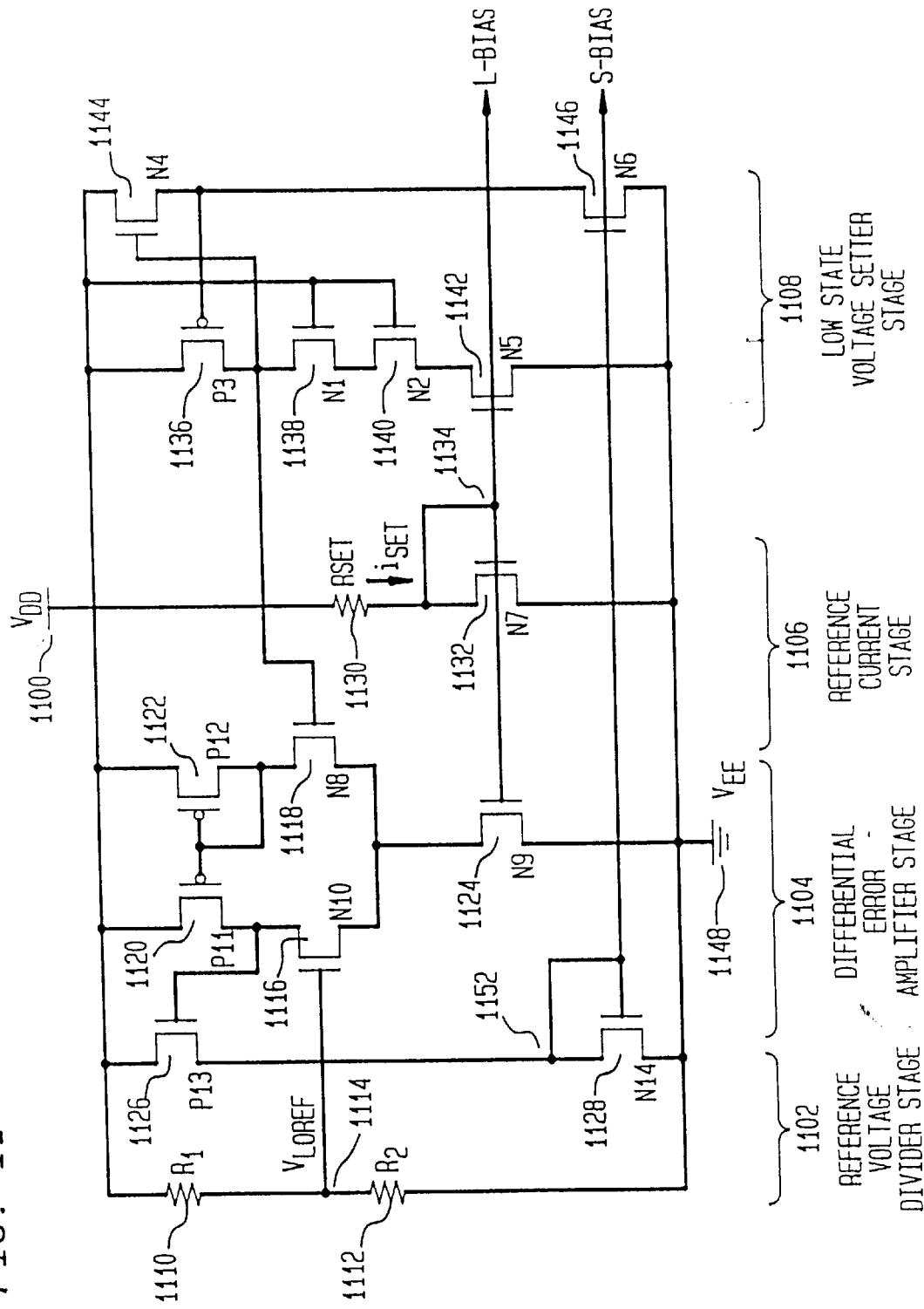
FIG. 11 shows an analog bias generator circuit in accordance with the present invention.

Other circuits can also use the dynamically biased active load inventive device with advantage. For example, an analog bias generator circuit is shown in FIG. 11. FIG. 11 shows a novel means for generating separate bias voltages L-BIAS and S-BIAS. As previously stated, the L-BIAS voltage is used to set the operating point of the differential amplifier in the HS-CML logic function. The S-bias is used to set the operating level of the output sensing stage of the HS-CML device. The S-BIAS actually determines the device's low state output voltage level. The device's high state level is essentially equal to $V_{DD}$. Thus, control of S-BIAS sets the device's voltage swing between its logic low state and its logic high state.

The analog bias generator circuit shown in FIG. 11 is comprised of a reference voltage divider stage 1102, a differential error amplifier stage 1104, a reference current stage 1106, and a low state voltage-setter stage 1108. The reference voltage divider stage 1102 has two resistors, 1110 and 1112. tied in series and coupled between the supply rails $V_{DD}$ 1100 and $V_{EE}$ 1148. Rail $V_{EE}$ 1148 is often at ground potential. The resistor junction 1114 forms a low voltage reference signal, $V_{LOREF}$.

The differential error amplifier stage 1104 is comprised of differential input transistors 1116, 1118, 1120 and 1122. Its error-voltage output is formed at the junction of transistors 1116 and 1120 drives transistor 1126. Node 1152, at the junction of transistor 1126 and diode-connected transistor 1128 forms the S-BIAS voltage.

The reference current stage 1106 is comprised of resistor 1130 and diode-connected transistor 1132 connected in series and coupled between the supply rails $V_{DD}$ 1100 and $V_{EE}$ 1148. Resistor 1130 and transistor 1132 together form a voltage divider between the power rails. Node 1134, at the junction of the transistor and the resistor, forms the L-BIAS voltage.

The low state voltage-setter stage 1108 is comprised of transistors 1136, 1138, 1140 and 1142 connected in series and coupled between the supply rails $V_{DD}$ 1100 and $V_{EE}$ 1148. Its output 1150 is formed at the junction of transistors 1136 and 1138. Transistor 1136 is the voltage-setter stage's 1108 active load which is dynamically biased by transistor 1144. Transistor 1144 is fed by the current source formed with transistor 1146. The voltage-setter stage's 1108 output 1150 provides one input to differential error amplifier stage 1104. Low voltage reference signal, $V_{LOREF}$ 1114, provides the second input to the differential error amplifier stage 1104. The difference between these two input signal forms the low state voltage error signal at the differential amplifier output 1154. This error signal is used to form S-BIAS as described above.

The so developed S-BIAS signal at node 1152, is used to drive the sensing current source transistor 1146 and transistor 1126 of this analog bias generator, and all the sensing current sources in the HS-CML device used. Thus the negative feedback loop sets the logic low state of the voltage setter stage 1108, as well as the active logic gates of the HS-CML device. Similarly, the so developed L-BIAS signal at node 1134, is used to drive the respective current sources 1124, 1132 and 1142 of differential error amplifier stage 1104, reference current stage 1106, and low state voltage-setter stage 1108.

In one embodiment, portions of the bias generator circuit are external to the low state voltage setter and/or the differential amplifier stages. This enables a user to set the L-BIAS and S-BIAS differently according to the external portions. There may be advantages to be able to set $V_{LOREF}$ and/or L-BIAS externally.

Figure 12:
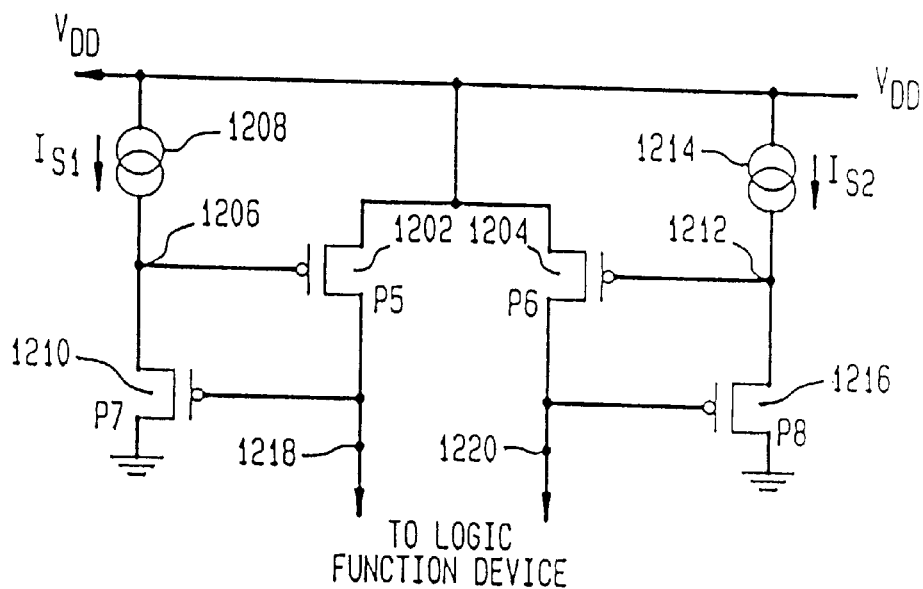
FIGS. 12 and 13 show alternate implementations of the present invention for a dynamically biased active load.
Figure 13:
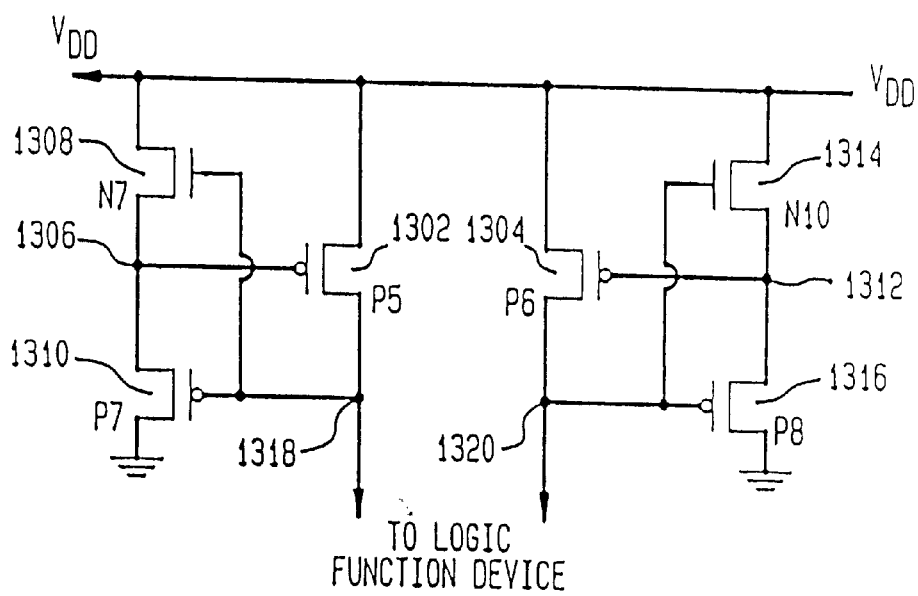

FIGS. 12 and 13, show alternate implementations of the present invention for a dynamically biased active load. The important feature in all these and other such implementations is that the input, usually the gate or base, of each active load should be driven from its respective output by a voltage follower with a gain less than or equal to one. The voltage follower provides both the desired signal delay and negative feedback. In applications requiring more delay, a delaying device could be added before or after the output sensing transistor. This may also be accomplished with the addition of amplifying and or delaying transistors in the output sensing path. Care must be exercised to maintain the feedback as negative, so any added transistors must act such as not to produce overall signal inversion.

FIG. 12 shows an output sensing circuit formed with its current source tied to $V_{DD}$ rather than to ground or to $V_{EE}$. Dynamic biasing is provided for a pair of active loads formed respectively with transistors 1202 and 1204. Transistor 1202 is dynamically biased with the voltage formed at node 1206, at the junction of current source 1208 and transistor 1210. Similarly, transistor 1204 is dynamically biased with the voltage formed at node 12012 at the junction of current source 1214 and transistor 1216. Output nodes 1218 and 1220 are coupled to the complementary outputs of the device's logic function.

FIG. 13 shows an output sensing circuit formed with a pair of transistors coupled in series between the power supply rails, $V_{DD}$ and ground (or $V_{DD}$ and $V_{EE}$). Dynamic biasing is provided for a pair of active loads formed respectively with transistors 1302 and 1304. Transistor 1302 is dynamically biased with the voltage formed at node 1306, at the junction of transistor 1308 and transistor 1310. The gates of both transistors 1308 and 1310 are coupled to output node 1318. Similarly, transistor 1304 is dynamically biased with the voltage formed at node 1312 at the junction of transistor 1314 and transistor 1316. The gates of both transistors 1314 and 1316 are coupled to output node 1320. Output nodes 1318 and 1320 are coupled to the complementary outputs of the device's logic function.

Although the description is made for particular circuit arrangements, the intent and concepts of the present invention are suitable and applicable to other semiconductor technologies and arrangements. It will be clear to those skilled in the art that other modifications to the disclosed embodiments can be effected without departing from the spirit and scope of the invention.

What is claimed is:

1. A device comprising:
    a plurality of I/O transistors, each I/O transistor having an I/O transistor input terminal being a device input adapted to receive a corresponding external signal, and an I/O transistor output terminal, at least one I/O transistor output terminal being a device output adapted to transmit a signal externally;
    a plurality of active loads, each of said active loads having an active load input, each active load being coupled to a different I/O transistor output terminal and serving as an I/O transistor load of said different I/O transistor output terminal; and
    a plurality of output sensing circuits, each output sensing circuit being coupled to a different one of said active loads, each output sensing circuit having a sensing input coupled to said different I/O transistor output terminal, a sensing output coupled to said active load input of said different one of said active loads, a voltage gain less than unity and a delay;
    said sensing circuit providing negative feedback to said active load, and wherein an output signal at the device output swings substantially from 1.1 to 1.4 volts, when the device is energized from a voltage source of 1.4 volts and the external signal swings substantially from 1.4 to 1.1.

2. A device as in claim 1 wherein each said I/O transistor output terminal is a logical output of a logic circuit.

3. A device as in claim 2 wherein said logic circuit is a MOSFET CML type circuit.

4. A device as in claim 1 wherein said device is formed using bipolar semiconductor technology.

5. A device as in claim 1 wherein said sensing means provides a dynamic bias to said load input.

6. A device as in claim 1 wherein said sensing means is comprised of:
    a sensing transistor having a sensing transistor supply terminal coupled to a first supply rail, a sensing transistor input terminal forming said sensing input, and a sensing transistor output terminal forming said sensing output; and
    a sensing current source coupled between said sensing output and a second supply rail.

7. A device as in claim 6 wherein said sensing current source having a sensing current source input to accept a sensing bias.

8. A device as in claim 7 wherein said logic circuit having a differential amplifier configuration, and further comprised of an amplifier current source, said amplifier current source having an amplifier current source input to accept a logic bias.

9. A device as in claim 1 wherein said sensing circuit is comprised of:
    a first transistor having a first transistor supply terminal coupled to a first supply rail;
    a second transistors having a second transistor input terminal common with a first transistor input terminal of said first transistor and forming said sensing input, a second transistor output terminal common with a first transistor output terminal of said first transistor and forming said sensing output, and a second transistor supply terminal coupled to a second supply rail.

10. A device as in claim 9 wherein said first supply rail is at ground potential.

11. A device as in claim 2 wherein said logic circuit performs an AND/NAND logic function.

12. A device as in claim 2 wherein said logic circuit performs an OR/NOR logic function.

13. A device as in claim 2 wherein said logic circuit performs an inverting buffer logic function.

14. A device as in claim 2 wherein said logic circuit performs an XOR/XNOR logic function.

15. A device as in claim 2 wherein said logic circuit performs a logic function of a majority function gate.

16. A device as in claim 2 wherein said logic circuit performs a logic function of a master-slave flip flop.

17. A device as in claim 1 wherein said active load has a load bias current of less than 25 microamperes.

18. A device as in claim, 1 wherein the device is resistorless.

19. A device as in claim, 1 wherein the device output is a single inversion of the device input.

20. A logic gate comprising:

a plurality of active loads; and a plurality of time-delayed negative feedback bias circuits, each of the bias circuits is coupled to a different one of said active loads, the logic gate having a plurality of logic gate inputs adapted to receive an external input signal and a plurality of logic gate outputs, at least one of said logic gate outputs being adapted to transmit an output signal externally, each of said active loads having no resistors and serving as a load to a different one of said logic gate outputs, and each said logic gate output having an output signal being a single inversion of the external input signal at said logic gate input and being delayed from the external signal by a propagation delay resulting from a single active component, and wherein said bias circuit dynamically biasing said active load such that said active load presents an effective load that varies according to a logic state of said logic gate output, and wherein an output signal at said at least one of said logic gate outputs swings substantially from 1.1 to 1.4 volts, when the device is energized from a voltage source of 1.4 volts and the external input signal swings substantially from 1.4 to 1.1.

21. A gate as in claim 20 wherein said active load becomes turned-on less strongly when said at least one output is in a high logic state, and becomes turned-on more strongly when said at least one output is in a low logic state.

22. A gate as in claim 20 wherein said bias circuit controls a logic swing of said output.

23. A gate as in claim 22 wherein said logic swing is between $V_{DD}$ and ($V_{DD}$−300 mv).

24. A gate as in claim 21 wherein a transition time for changing between said high logic state and said low logic state is less than 200 ps.

25. A method for dynamically biasing each of a plurality of active loads within a device, said method comprising the steps of:

providing each of said active loads with a load input and a load output, said active loads being resistorless, said load output being coupled to a circuit output of said device, said circuit output being adapted to transmit an output signal externally, and having a signal with a signal level;

sensing said signal;

amplifying said signal level with a gain of less than unity;

delaying said signal to form a delayed output; and feeding said delayed output to said load input to provide negative feedback to said at least one active load, and wherein an output signal at the circuit output swings substantially from 1.1 to 1.4 volts, when the device is energized from a voltage source of 1.4 volts and a device input signal swings substantially from 1.4 to 1.1.

26. A method as in claim 25 wherein said circuit output is an output of a CML circuit.

27. A method as in claim 25 wherein said step of sensing is comprised of the steps of:

providing a transistor having a transistor supply terminal coupled to a first supply rail, a transistor input terminal forming a sensing input, a transistor output terminal forming said delayed output; and providing a sensing current source coupled between said delayed output and a second supply rail.

28. A method as in claim 27 wherein said sensing current source having a sensing current source input to accept a sensing bias.

29. A method as in claim 26 wherein said CML circuit having a differential amplifier configuration, and is further comprised of an amplifier current source, said amplifier current source having an amplifier current source input to accept a logic bias.

30. A device comprising:

a plurality of transistors, at least one input circuit element, each circuit element consisting of one of said transistors and having at least one device input adapted for receiving an external input signal and at least one device output adapted to provide an output signal, said device output having an output signal being a single inversion of the external input signal, each circuit element having:
an active load coupled to said at least one device output, said active load having a load input, and
an output sensing circuit having a sensing input coupled to said at least one device output, a sensing output coupled to said load input, a voltage gain less than unity and a delay, said sensing circuit providing negative feedback to said active load, and wherein an output signal at said at least one device output swings substantially from 1.1 to 1.4 volts, when the device is energized from a voltage source of 1.4 volts and a signal at said at least one device input swings substantially from 1.4 to 1.1.

31. A logical gate comprising:

a plurality of transistors;

at least one of said transistors having a first transistor node being a gate input node adapted to receive an external signal and a second transistor node being a gate output node, each gate output node having an active load, said active load having a load input;

at least one output sensing circuit having a sensing input, a sensing output, a voltage gain less than unity and a delay, the sensing input being coupled to said at least one gate output, a sensing output coupled to said load input, node coupled to said gate output node, a sensing output coupled to said load input;

said sensing circuit providing negative feedback to said active load, and wherein an output signal at said a second transistor node swings substantially from 1.1 to 1.4 volts, when the device is energized from a voltage source of 1.4 volts and an input signal at said first transistor node swings substantially from 1.4 to 1.1.

32. An electrical device comprising:

a logic circuit having at least one logic input node adapted to accept an external signal and forming a device input, at least one logic output node, and at least one logic bias node directly connected to a first current source;

an active load transistor for each said logic output node each active load transistor having a first load node directly connected to a corresponding logic output node, a second load node directly connected to a power rail, and a third load node for receiving a load control signal;

a bias transistor for each load transistor, each bias transistor having a first bias node directly connected to said corresponding logic output node, a second bias node directly connected to said power rail, and a third bias node directly connected both to a second constant current source and to said third load node for supplying said load control signal;

wherein an output signal swing of the logic output node is substantially equal to an input signal swing of the external signal at the logic input node.

33. An electrical device comprising:

a logic circuit having at least one logic input node adapted to accept an external signal and forming a device input, at least one logic output node, and at least one logic bias node connected to a first current source;

an active load transistor for each said logic output node, each active load transistor having a first load node connected to a corresponding logic output node, a second load node connected to a power rail, and a third load node for receiving a load control signal; and a bias transistor for each load transistor, each bias transistor having a first bias node connected to said corresponding logic output node, a second bias node connected to said power rail, and a third bias node connected both to a second current source and to said third load node for supplying said load control signal, and wherein an output signal at said at least one logic output node swings substantially from 1.1 to 1.4 volts, when the device is energized from a voltage source of 1.4 volts and a signal at least one logic input node swings substantially from 1.4 to 1.1.

34. An electrical device as recited in claim 44, wherein said logic circuit is an AND gate.

* * * * *